United States Patent
Stanley

(10) Patent No.: US 7,288,977 B2
(45) Date of Patent: Oct. 30, 2007

(54) HIGH RESOLUTION PULSE WIDTH MODULATOR

(75) Inventor: Michael E. Stanley, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 7 days.

(21) Appl. No.: 11/040,089

(22) Filed: Jan. 21, 2005

(65) Prior Publication Data

US 2006/0164142 A1    Jul. 27, 2006

(51) Int. Cl.
    *H03K 5/13*    (2006.01)
    *H03M 3/335*   (2006.01)
(52) U.S. Cl. .................. 327/172; 327/175; 327/276; 327/281
(58) Field of Classification Search ........ 327/172–176, 327/261, 276, 281
    See application file for complete search history.

(56) References Cited

U.S. PATENT DOCUMENTS

| | | | | |
|---|---|---|---|---|
| 6,060,923 | A * | 5/2000 | Sasaki | 327/175 |
| 6,064,278 | A * | 5/2000 | Tanizawa | 332/109 |
| 6,121,811 | A * | 9/2000 | Scott et al. | 327/276 |
| 6,658,583 | B1 | 12/2003 | Kudo et al. | |
| 6,781,433 | B2 * | 8/2004 | Mori | 327/337 |
| 7,050,781 | B2 * | 5/2006 | Khalil et al. | 455/340 |
| 2002/0041246 | A1 | 4/2002 | Chang et al. | |
| 2003/0156636 | A1 | 8/2003 | Klemish et al. | |
| 2005/0184778 | A1 * | 8/2005 | Figoli | 327/172 |

OTHER PUBLICATIONS

Dancy, Abram, "High-Efficiency Multiple-Output DC—DC Conversion for Low-Voltage Systems," IEEE, vol. 8, No. 3, Jun. 2000.
Patella, Benjamin, "High-Frequency Digital PWM Controller IC for DC—DC Converters," IEEE, vol. 18, No. 1, Jan. 2003.
Barr, Michael, "Introduction to Pulse Width Modulation (PWM)," Michael Barr's Embedded Systems Glossary, www.netrino.com/Publications/Glossary/PWM.html, 2001.

* cited by examiner

*Primary Examiner*—Dinh T. Le
(74) *Attorney, Agent, or Firm*—Ingrassia Fisher & Lorenz

(57) ABSTRACT

A pulse width modulator (100) and method that facilitates high resolution pulse width modulation is provided. The pulse width modulator (100) creates a pulse width modulated signal having a duty cycle that is proportional to a controllable delay in the modulator. The pulse width modulator combines a first digitally controllable delay (102) with a delay adjustment (104) to provide the controllable delay. In one embodiment, a digital counter (202) is used to provide coarse delay, with the delay adjustment device (210) coupled to the digital counter (202) to provide the fine, high resolution, delay control. Together the digital counter (202) and delay adjustment device (210) provide high resolution pulse width modulation. In one particular implementation, the analog delay adjustment device (100) comprises a delay block (500) designed to provide delay adjustment that is selectively controllable by changing a capacitance in the device.

18 Claims, 4 Drawing Sheets

| PHASES | SWITCH 504 | SWITCH 506 | SWITCH 512 |
|---|---|---|---|
| DISCHARGE | OPEN | CLOSED | CLOSED |
| PRECHARGE | CLOSED | OPEN | CLOSED |
| DELAY | OPEN | OPEN | OPEN |

600

700

HIGH RESOLUTION PULSE WIDTH MODULATOR

FIELD OF THE INVENTION

This invention generally relates to electronic devices, and more specifically relates to pulse width modulators.

BACKGROUND OF THE INVENTION

Electronic devices are becoming increasingly important in everyday modern life. Many electronic devices use pulse width modulation for a variety of purposes. In general, pulse width modulation is a technique where a continuous or analog signal is represented by a digital signal in which the duty cycle of the digital signal, over some period of time, varies directly with the value of the original analog signal. Duty cycle is the ratio of two numbers: the time in one period that signal is at logic high (or low) divided by the total period. This is usually represented as a percentage. The resulting digital signal is said to be Pulse Width Modulated. This signal can be converted back into analog form by the simple expedient of passing it through a low analog filter.

Pulse width modulation is used for a variety of purposes. For example, pulse width modulation is commonly used in measurement, control, power supplies and communication devices. As a specific example, pulse width modulation can be used to digitally encode sound. As another specific example, pulse width modulation is commonly used for motor control. Of course, these are just some of the many applications in which pulse width modulation is used.

One issue with pulse width modulation is the resolution of the modulation. In general, the resolution of a pulse width modulator is defined as how precisely the modulator can control the duty cycle of the signal. Resolution and bandwidth are competing criteria in many digital pulse width modulator circuits. Increasing resolution will decrease the bandwidth of the signal which can be represented by the pulse width modulated signal. For example, one typical pulse width modulator may be able to control the timing of high and low edge transitions on the pulse width modulated waveform used to compute duty cycle to within 20 nanoseconds, while other pulse width modulators may provide higher or lower resolution.

In some digital pulse width modulators the resolution of the modulator is tied to the clock frequencies used to generate the pulse width modulated signals. Unfortunately, in many cases it may not be possible or desirable to include a high speed clock for pulse width modulation. In these cases traditional techniques for digital pulse width modulation may be unable to achieve the desired resolution. Other solutions that can provide higher resolution suffer from other limitations, such as unacceptable difficulty in adapting these solutions to digital control Thus, there is a continuing need for pulse width modulation techniques that provide relatively high resolution without requiring high speed clocks to achieve the needed level of resolution.

BRIEF DESCRIPTION OF DRAWINGS

The preferred exemplary embodiment of the present invention will hereinafter be described in conjunction with the appended drawings, where like designations denote like elements, and.

DETAILED DESCRIPTION OF THE INVENTION

The present invention provides a pulse width modulator and method that facilitates high resolution pulse width modulation. The pulse width modulator creates a pulse width modulated signal having a duty cycle that is proportional to a controllable delay in the modulator. The pulse width modulator combines a first digitally controllable delay with a delay adjustment to provide the controllable delay that facilitates high resolution pulse width modulation.

Figure 1:
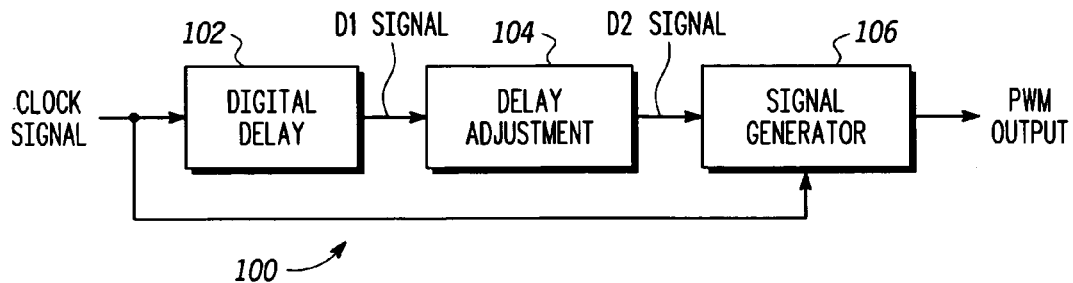
FIG. 1 is a schematic view of a pulse width modulator in accordance with an embodiment of the invention.

Turning now to FIG. 1, a pulse width modulator 100 is illustrated schematically. The pulse width modulator 100 includes a digital delay 102, a delay adjustment 104 and a signal generator 106. The pulse width modulator 100 receives a clock signal and produces a pulse width modulated output. Specifically, the pulse width modulator 100 produces a signal having a duty cycle that is proportional to the delay in the digital delay 102 and delay adjustment 104. By controlling the delay in the digital delay 102 and delay adjustment 104, the duty cycle of the output can be selectively controlled, thus producing a pulse width modulated signal.

Specifically, the digital delay 102 is used to provide a coarse delay, with the delay adjustment 104 providing a fine, high resolution, delay control. Together the digital delay 102 and the delay adjustment 104 provide high resolution pulse width modulation.

In one particular implementation, the delay adjustment 104 comprises a delay block designed to provide delay adjustment that is selectively controllable by changing a capacitance in the device. The variable capacitor provides the ability to precisely control delay in the pulse width modulator, thus facilitating high resolution control of duty cycle in the pulse width modulated signal.

The pulse width modulator 100 can provide relatively high resolution control of the duty cycle without requiring the use of high speed clocks that may not be readily available in some applications. Additionally, the pulse width modulator 100 can provide high resolution control of the duty cycle in a pulse width modulator that is programmable and amenable to digital control. Thus, the pulse width modulator 100 can be adapted to a wide variety of applications where high resolution pulse width modulation with digital control is desirable.

Figure 2:
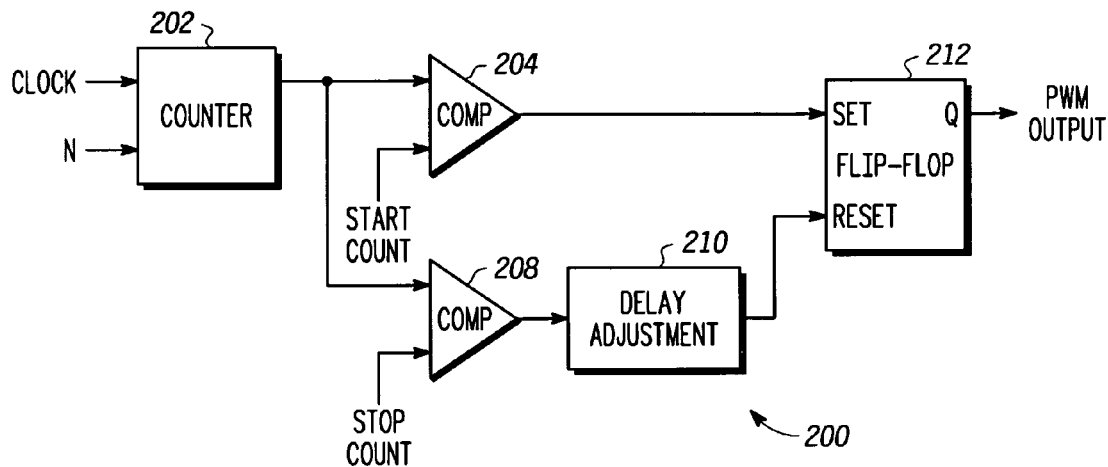
FIG. 2 is a schematic view of a second pulse width modulator in accordance with an embodiment of the invention.

Turning now to FIG. 2, a pulse width modulator 200 in accordance with an embodiment of the invention is illustrated. The pulse width modulator 200 creates a pulse width modulated signal having a duty cycle that is proportional to a controllable delay in the modulator. Specifically, the pulse width modulator 200 combines a first digitally controllable delay with a delay adjustment to provide a controllable delay that facilitates high resolution pulse width modulation.

The pulse width modulator 200 includes a counter 202, a comparator 204, a second comparator 208, a delay adjustment 210, and a flip-flop 212. In general, the counter 202 determines the period of the pulse width modulated signal. The comparator 204 and comparator 208 provide a coarse determination of the duty cycle of the pulse width modulated signal. Specifically, comparator 204 and comparator 208 provide a controllable coarse delay, and the delay adjustment 210 provides a controllable fine delay. The flip-flop 212 generates the pulse width modulated output signal having a period determined by the counter 202 and a duty cycle determined by sum of the delays generated by counter 202, comparator 204, comparator 208 and delay adjustment 210.

Specifically, the counter 202 receives a clock signal and a control value N. The control value N determines the period of the resulting pulse width modulated signal. Specifically, the period of the pulse width modulated signal will be equal to N times the period of the clock signal.

The counter 202 counts down from a specified value of N to zero. The comparator 204 is a digital comparator that compares the output of the counter 202 to a start count value. The start count value is a selectable value that determines at what count value from the counter (between 1 and N) the PWM will become asserted on. As one example, the start count can be set at zero for cases where the PWM output is to be asserted at the start of each period.

When the counter 202 reaches the start count value, the comparator 204 output is asserted. This asserted output is passed to the SET input of the flip-flop 212. This causes the PWM output to become asserted, and thus triggers the start of the PWM output signal period. The counter 202 will continue to run. Generally, the counter 202 will be configured to automatically roll over when it reaches zero and begin down counting again to determine the next signal period.

Figure 3:
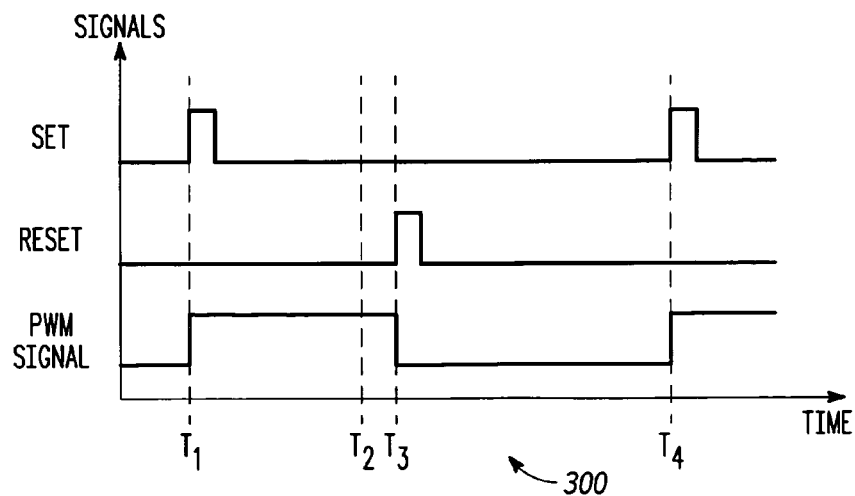
FIG. 3 is a graph view of pulse width modulation waveforms in accordance with an embodiment of the invention.

Turning briefly to FIG. 3, a graph 300 shows exemplary waveforms for the SET, RESET and PWM output signals in pulse width modulator 200. Time $T_1$ corresponds to when the SET input of flip-flop 212 is asserted, which causes the output of the flip-flop 212 to become asserted. The asserting of the SET input thus starts the period of the PWM output signal.

Returning to FIG. 2, the asserted output of the counter 202 is also passed to the comparator 208. The comparator 208 is a digital comparator that compares the output of the counter 202 to a stop count value. When the counter 202 reaches the stop value, the comparator 208 output is asserted.

The delay between when the first comparator 204 output was asserted and when the second comparator output 208 is asserted is a first digital controllable delay. This delay will be approximately equal to the difference between the start count value and the stop count value times the period of the clock signal. Thus, by selecting values for the start count value and stop count value the digital delay can be selectively controlled. However, this delay can only be controlled to a resolution equal to the period of the incoming clock signal.

The asserted output of the comparator 208 is thus a delayed signal that is passed to the delay adjustment 210. The delay adjustment 210 provides a fine, high precision delay that will be used to provide more precise control over the duty cycle of the PWM signal. The output of the delay adjustment 210 is a delayed signal with an overall delay substantially equal to the first delay provided by the counter 202, comparator 204, and comparator 208, plus the second, fine tuning delay, provided by the delay adjustment 210. This delayed signal is outputted from the delay adjustment 210 and passed to the RESET input of the flip-flop 212. When the reset input is asserted by the delayed signal the PWM out is unasserted.

Returning briefly to FIG. 3, time $T_3$ corresponds to when the RESET input of flip flop 212 is asserted, un-asserting the output of the flip flop 212, and thus ending the asserted portion of the PWM output signal. Thus, the period of time between when the SET input is asserted by the comparator 204 output (e.g., $T_1$) and when the RESET input is asserted by the delayed signal from the delay adjustment (e.g., $T_3$) is the asserted time in the PWM output. This period of time is substantially equal to the delay provided by the counter 202 and the difference between the start count value, and the stop count value, (e.g., $T_1$-$T_2$) plus the delay provided by the delay adjustment (e.g., $T_2$-$T_3$). Thus, by controlling the delay in the counter 202, comparators 204 and 208, and the delay adjustment 210 the duty cycle of the PWM output signal can be selectively controlled.

Returning to FIG. 2, when the counter 202 again reaches zero it rolls over, restarting the counter 202 at the value N. When the counter 202 rolls over, the output of comparator 204 is again asserted, causing the SET input of flip-flop 212 to again be asserted. This again asserts the PWM output, thus ending the current period and starting the next period. Each PWM output period will thus be equal to approximately N times the period of the clock signal. Thus, by selecting N, the period the PWM output signal can be controlled.

Returning to FIG. 3, at time $T_4$, the SET input is again asserted by the counter 202 and comparator 204, causing the PWM output to again become asserted. Thus, the time period from $T_1$ to $T_4$ is the period of the PWM output signal, and it can be selectively controlled using the value N in the counter 202.

It should be noted that in most applications it will be desirable to stretch the delay adjustment 210 that is inputted to the RESET input of flip-flop 212. Otherwise, cases where a very large amount of delay adjustment is needed could result in the next clock edge being very close to the negative going RESET input edge, resulting in a very short duration RESET pulse. The delay adjustment 210 output could be pulse stretched one-half to one clock cycle to avoid a RESET pulse that would otherwise be short enough to cause unwanted glitches. A variety of different devices can be used to stretch the delay adjustment 210 output, including the use of an additional flip flop.

A variety of different devices can be used to implement pulse width modulator 200. For example, a variety of different types of counters can be used for counter 202. As described above, the counter 202 can be implemented with a down counter that counts from N to 0. Alternatively, an up counter that counts from 0 to N can be used. In either case the start count and stop count values would be appropriately selected to provide the desired coarse delay.

In a further variation an additional delay adjustment can be provided between comparator 204 and flip flop 212. This additional delay adjustment would be used to fine tune the delay between the start of the period and the leading edge of the PWM output signal. This can be useful in applications such as center-aligned PWM applications where the asserted portion of the PWM signal is controlled to be in the middle of a defined period.

Figure 4:
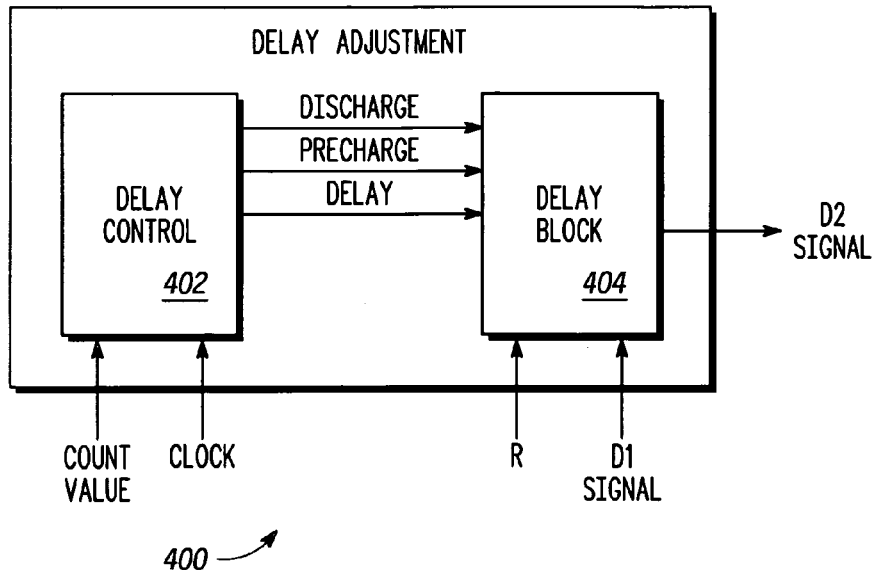
FIG. 4 is a schematic view of an analog delay adjustment in accordance with an embodiment of the invention.

Turning now to FIG. 4, an embodiment of a delay adjustment device 400 is illustrated schematically. The delay adjustment device 400 is exemplary of the type of devices that can be used in the pulse width modulators illustrated in FIGS. 1 and 2 (e.g., as delay adjustment 104 and 210). The delay adjustment 400 provides a controllable, high resolution delay that is used to provide fine control over the duty cycle of the pulse width modulated signal.

The delay adjustment 400 includes a delay control 402 and a delay block 404. The delay control 402 receives a count value input and a clock input. From this the delay control controls the delay block 404. Specifically, the delay control determines what operational state the delay block should be in and passes the appropriate control signal to the delay block 404. In the illustrated embodiment the delay control 402 selectively provides a precharge, discharge, and delay signal to the delay block 404. The delay block 404 also receives the value R used to control the amount of delay provided by the delay adjustment 400.

During operation, the delay control 402 receives the clock signal and the count value. The count value is preferably provided from the digital delay device, and is used to indicate when the application of the digital delay is to be provided. In the example of FIG. 2, the count value would preferably be provided from counter 202. The count value could thus comprise the current value from the counter 202, as it counts down from N to 0. In the alternative, the count value can comprise a signal that indicates the counter 202 has reached a specified value. In any case count value can be provided to the delay control 402 in any suitable format.

Specifically, it should be noted that the count value can provided to the delay adjustment 400 directly from the counter (e.g., counter 202), or through other logic such as through a comparator (e.g., comparator 208). In cases where the count value is provided directly from the counter the function of the comparator can be implemented as part of the delay control 402. In another alternative, the count value can be provided in the form of the output of the comparator 208. In any case the count value is provided to the delay adjustment to indicate the end of the digital delay, and thus when the start of the fine tuning delay adjustment is to occur.

As stated above, the delay control 402 provides a precharge, discharge, and delay signal to the delay block 404. These signals correspond to three phases of activity in the delay adjustment 400. Specifically, the discharge phase corresponds to when the delay block is not providing a delay, such as before or after a delay is needed. The precharge phase corresponds to charging that occurs immediately before a delay is needed. The delay phase then corresponds to when the delay is provided by the delay block.

As one example of how these phases can be implemented, the default control condition would typically be the discharge phase except for immediately before and during when a delay is provided. During this phase the delay control 402 asserts the discharge signal provided to the delay block 404.

When the count value reaches a defined level the precharge phase begins. This corresponds to the time immediately preceding when the delay is to be provided, and facilitates preparing the delay block for generating the delay. In one embodiment, when the count value reaches 1 the precharge signal is provided to the delay block. In response, the delay block 404 prepares for delay, such as by charging capacitors used to determine the delay. When the precharge phase ends the delay control 402 asserts the delay signal. In one embodiment, when the count value reaches 0 the delay signal is provided to the delay block.

The delay block 404 then provides a D2 delayed signal. The D2 delayed signal comprises a signal that has an additional delay over the received D1 delayed signal. Thus, the D2 signal can be described as a further delayed D1 signal, with the amount of further delay determined by the provided R value. As an example, the D2 delayed signal is provided to the RESET input to the flip-flip as illustrated in FIG. 2. As will be described in greater detail below, because the block 404 can provide the delay with higher precision the D2 delayed signal can be used to provide high resolution control over the duty cycle of the pulse width modulated signal.

The delay control 402 can be implemented using any suitable device. For example, it can be implemented using a state machine design implemented with logic devices. It could also be implemented using any suitable control device.

Figure 5:
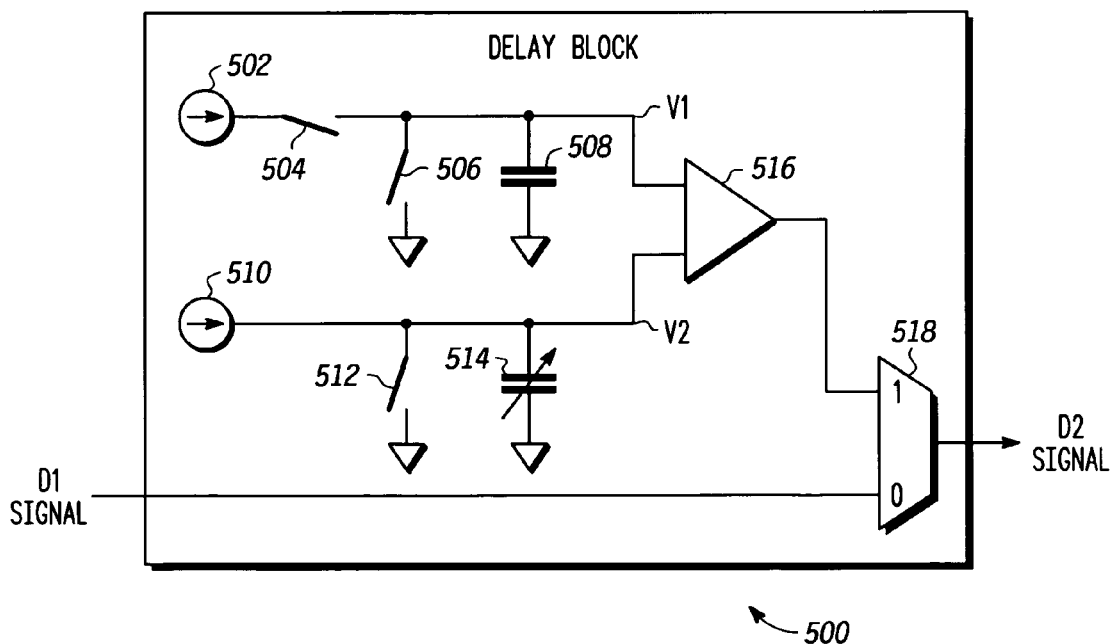
FIG. 5 is a schematic view of a delay block in accordance with an embodiment of the invention.

The delay block 404 can also be implemented using a variety of devices. In one example, the delay block 404 is implemented using a switched capacitor circuit. Turning now to FIG. 5, an exemplary delay block 500 is illustrated that uses switched capacitors to provide high resolution delay control.

The delay block 500 includes current sources 502 and 510, switches 504, 506 and 512, capacitor 508, variable capacitor 514, comparator 516 and multiplexer 518. In general, the delay block 500 provides a controllable high precision delay by selectively varying the variable capacitor 514, operating switches 504, 506 and 512, and comparing the voltages at nodes V1 and V2. In general, capacitor 508 is charged to a voltage during the precharge phase. Then, during the delay phase variable capacitor 514 is charged. When the voltage at V2 exceeds the voltage at V1, the comparator 516 output will be asserted.

This asserted signal is then passed through the multiplexer 518 as the D2 delayed signal. The amount of delay in the D2 delayed signal is determined by how long it takes for the voltage V2 to exceed voltage V1. In general this depends upon the relative capacitance of the capacitors 508 and 514. Because capacitor 514 is a variable capacitor, it can be controllably varied to precisely control the amount of delay provided by the delay block.

Figures 6, 7:
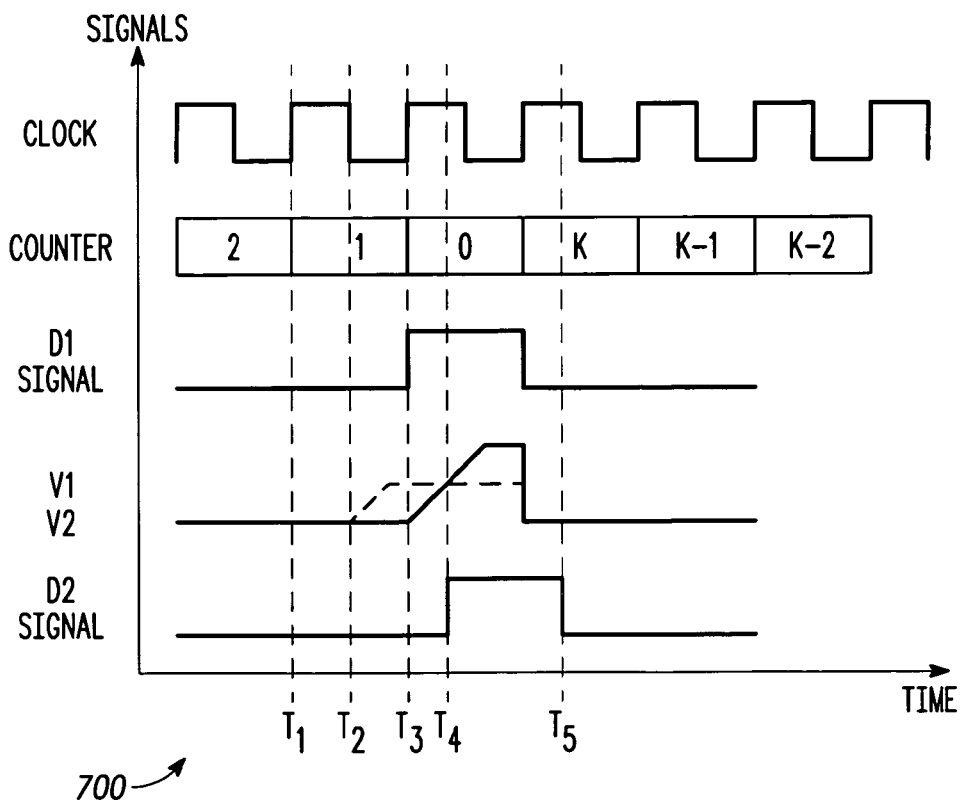
FIG. 6 is a schematic view of a control truth table in accordance with an embodiment of the invention.
FIG. 7 is a graph view of delay adjustment waveforms in accordance with an embodiment of the invention.

Turning now to FIG. 6, a truth table 600 illustrates how switches 504, 506, and 512 can be operated during the precharge, discharge, and delay phases. As described above with reference to FIG. 4, the control block 402 can provide corresponding control signals during each of these three phases. These control signals can then be used to control the switches in the delay block 500. Referring to FIGS. 5 and 6 together, during discharge no delay is occurring or imminent, and the capacitors are discharged by opening switch 504 and closing switches 506 and 512. With switch 504 open no current will flow from current source 502. Likewise, with switches 506 and 512 closed the capacitors 508 and 514 will be discharged, resulting in no voltage at nodes V1 and V2.

Then, at the start of the precharge phase switch 504 is closed, switch 506 is opened, while switch 512 remains closed. This causes current to flow from current source 502 to the capacitor 508, causing a charge to be stored on capacitor 508 and building a voltage at node V1. The amount of voltage at node V1 will depend upon the amount of current provided by current source and the size of the capacitor 508, and the length of the time the current is provided. It should also be noted that the current provided by the current source 502 and the capacitance of the capacitor 508 are thus preferably selected such that the voltage at node V1 reaches a desired level within the time allocated for charging the capacitor during the precharge phase.

Then at the start of the delay phase switch 504 and 512 are opened, while the switch 506 remains open. Opening switch 504 causes the current source 502 to stop providing current to capacitor 508. Because switch 506 remains open the voltage at node V1 will hold at a substantially constant value. Likewise, opening switch 512 causes the current source 510 to begin charging variable capacitor 514, creating a voltage at node V2. This voltage will continue to rise as long as the current source 510 charges the variable capacitor 514. Eventually, the voltage V2 will exceed the voltage at node V1, causing the comparator 516 output to be asserted.

This asserted signal is then passed through the multiplexer 518 as the D2 delayed signal. The amount of delay in the D2 delayed signal is equal to how long it takes for the voltage at V2 to exceed the voltage at V1 after the start of the delay phase. As stated above, the amount of time it takes for the voltage at V2 to exceed the voltage at V1 will depend on several factors, most notably by the amount of capacitance in the variable capacitor 514. Because capacitor 514 is a variable capacitor, it can be controllably varied to precisely control the amount of delay provided by the delay block.

Specifically, the amount of delay $T_d$ provided by the delay adjustment can be expressed as:

$$T_d = \left(\frac{C_2}{C_1}\right)\left(\frac{I_1}{I_2}\right) T_p \qquad (1.)$$

where $C_2$ is the capacitance of the variable capacitor 514, $C_1$ is the capacitance of the capacitor 508, $I_1$ is the current provided by current source 502, $I_2$ is the current provided by current source 510, and $T_p$ is the precharge time for the capacitor 510. The precharge time $T_p$ would be selected based on a variety of factors. As one example that will be illustrated below, the precharge time can be equal to one-half a clock period.

Thus, the amount of delay provided by the delay block 500 can be precisely controlled by varying the capacitance $C_2$ of the capacitor 514. A variety of different types of devices can be used to implement the capacitor 514. In one example embodiment, an array of smaller switched capacitors are coupled together and selectively switched on and off to provide the variable capacitor 514. Switched capacitors have the advantage of providing high precision variable capacitance in a system that is easily adapted for digital control. In any of these cases the capacitance of the variable capacitor is selectively controlled using the control value R that is inputted into the delay block for this purpose, which in turn controls the amount of delay provided.

The current sources and capacitors are chosen so that V1 & V2 are kept within the input range of the comparator for the longest clock period that is anticipated. Any clock period shorter than that will simply have the effect of using less of the comparator input range, as V1 will automatically decrease with the clock period. Thus, the delay adjustment has the ability to automatically adjust for different clock speeds.

In general, the variable capacitor 514 is selected to have a capacitance less than the capacitor 508. This insures that the delay provided by the delay adjustment 500 is less than would cause an overlap into the next full clock period of the PWM signal. It should be noted that while the current source 502 and current source 510 are illustrated as two separate current sources, that these current sources could be implemented with a single current source.

In some cases no additional delay will be needed. In those cases the multiplexer 518 can be used to pass the D1 delayed signal instead of the signal generated by the comparator 516. Thus, the delay block 500 can provide substantially no delay when needed. This can be used in the first and last clock cycles of a PWM period.

It should be noted that instead of, or in addition to, varying the capacitance to adjust the amount of delay that the delay can be adjusted by varying the current provided by current source 510. In this embodiment the current source 510 would be implemented with any suitable variable current source, and the variable current provided by that current source would determine the delay based on the time it takes to charge the capacitor using the variable current source.

It should also be noted that the delay block 500 is only one example of a suitable analog delay block that can be used in the embodiments of the invention, and that are designs are possible.

Turning now to FIG. 7, a graph 700 shows exemplary waveforms for the clock, counter, D1 signal, V1 and V2 voltages, and the D2 signal during operation of the delay block 500. Prior to time $T_1$ the delay block 500 is in the discharge phase, with no stored voltage on the capacitors. Then at time $T_1$ the counter output reaches 1. As described above, this is one example of a time that can serve as the start of the precharge phase. At time $T_2$, corresponding to the next trailing edge of the clock signal, switch 504 is closed and switch 506 is opened. This starts the precharging of the capacitor 508, as indicated by the increasing voltage at node V1.

Then, at time $T_3$ the counter reaches 0, indicating the start of the delay phase. At time $T_3$ switch 504 opens, causing the current source 502 to stop providing current to capacitor 508 and thus stopping the increase of the voltage at node V1. It should be noted that in this embodiment node V1 charges for exactly one half of a clock period before the current source is shut off. Because the amount of time of charge is precisely controlled and the current is precisely controlled, the amount of voltage at node V1 will also be precisely controlled.

At time $T_3$ switch 512 also opens, causing current from current source 510 to charge the variable capacitor 514, resulting in an increasing voltage at node V2. This voltage continues to rise until at time $T_4$ the voltage at node V2 exceeds the voltage at node V1. This causes the comparator 516 output to be asserted at time $T_4$, thus generating a D2 delayed signal. The leading edge of the D2 signal is passed to PWM signal generator, and is used to determine the end of the asserted portion of the PWM output signal. Thus, the time difference between the leading edge of the D1 delayed signal and the leading edge of the D2 delayed signal is the amount of additional delay provided by the delay block 500.

The D2 signal is then un-asserted at time $T_5$, thus putting the device back into the discharge phase before the end of the current PWM period, and thus before the start of the next PWM period.

Figure 8:
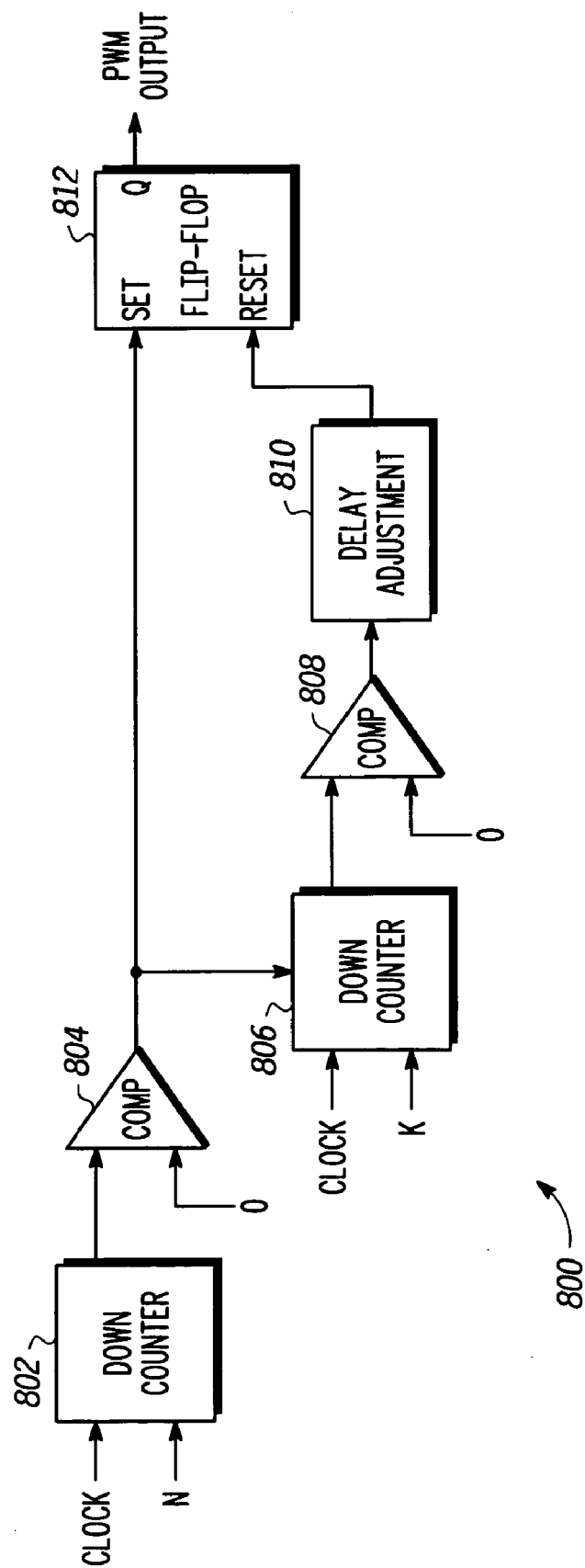
FIG. 8 is a schematic view of a pulse width modulator in accordance with another embodiment of the invention.

Turning now to FIG. 8, a pulse width modulator 800 in accordance with another embodiment of the invention is illustrated. The pulse width modulator 800 creates a pulse width modulated signal having a duty cycle that is proportional to a controllable delay in the modulator. Specifically, the pulse width modulator 800 combines a first digitally controllable delay with a delay adjustment to provide a controllable delay that facilitates high resolution pulse width modulation. In this embodiment however, a second counter is used to determine the digital delay that-defines the coarse adjustment of the duty cycle.

The pulse width modulator 800 includes a first down counter 802, a comparator 804, a second down counter 806, a second comparator 808, a delay adjustment 810, and a flip-flop 812. In general, the first down counter 802 and comparator 804 determine the period of the pulse width modulated signal. The second down counter 806 and comparator 808 provides a controllable coarse delay, and the delay adjustment 810 again provides a controllable fine delay. The flip-flop 812 generates the pulse width modulated output signal having a period determined by the down counter 802 and a duty cycle determined by sum of the delays generated by down counter 806 and delay adjustment 810.

Specifically, the down counter 802 receives a clock signal and a control value N, where the period of the pulse width modulated signal will be equal to N times the period of the clock signal. The down counter 802 counts down from a specified value of N to zero. The comparator 804 is a digital comparator that compares the output of the down counter 802 to a 0 value. When the down counter 802 reaches 0, the comparator 804 output is asserted. This asserted output is passed to the SET input of the flip-flop 812. This causes the PWM output to become asserted, and thus triggers the start of the PWM output signal period. The down counter 802 will then roll over and begin down counting again to determine the next signal period.

The asserted output of the comparator 804 is also passed to the down counter 806. The down counter 806 counts down from a specified value of K to zero. The signal from comparator 804 acts a trigger to reset the down counter 806, restarting the down count at the value K. The comparator 808 is a digital comparator that compares the output of the down counter 806 to a 0 value. When the down counter 806 reaches 0, the comparator 808 output is asserted.

The delay between when the first comparator 804 output was asserted and when the second comparator output 808 is asserted is a first digital controllable delay. This delay will be approximately equal to K times the period of the clock signal. Thus, by selecting a value for K the digital delay can be selectively controlled. However, this delay can only be controlled to a resolution equal to the period of the incoming clock signal.

The asserted output of the comparator 808 is a delayed signal that is passed to the delay adjustment 810. The delay adjustment 810 provides a fine, high precision delay that will be used to provide more precise control over the duty cycle of the PWM signal. The delay adjustment 810 can be implemented using the devices illustrated in FIGS. 4 and 5, to illustrate just one example. The output of the delay adjustment 810 is a delayed signal with an overall delay substantially equal to the first delay provided by the down counter 806 plus the second, fine tuning delay, provided by the delay adjustment 810. This delayed signal is outputted from the delay adjustment 810 and passed to the RESET input of the flip-flop 812. When the reset input is asserted by the delayed signal the PWM out is unasserted.

The period of time between when the SET input is asserted by the comparator 804 output and when the RESET input is asserted by the delayed signal from the delay adjustment is the asserted time in the PWM output. This period of time is substantially equal to the delay provided by the down counter 806 plus the delay provided by the delay adjustment. Thus, by controlling the delay in the down counter 806 and the delay adjustment 810 the duty cycle of the PWM output signal can be selectively controlled.

When the down counter 802 again reaches zero it rolls over, restarting the down counter 802 at the value N. When the down counter 802 rolls over, the output of comparator 804 is again asserted, causing the SET input of flip-flop 812 to again be asserted. This again asserts the PWM output, thus ending the current period and starting the next period. Each PWM output period will thus be equal to approximately N times the period of the clock signal. Thus, by selecting N, the period the PWM output signal can be controlled.

The present invention thus provides pulse width modulators and method that facilitates high resolution pulse width modulation. The pulse width modulator generates a pulse width modulated signal having a duty cycle that is proportional to a controllable delay in the modulator. The pulse width modulator combines a first digitally controllable delay with an analog delay adjustment to provide the controllable delay. In one embodiment, a digital counter is used to provide coarse delay, with the delay adjustment device coupled to the digital counter to provide the fine, high resolution, delay control. Together the digital counter and delay adjustment device provide high resolution pulse width modulation. In one particular implementation, the delay adjustment device comprises a delay block designed to provide delay adjustment that is selectively controllable by changing a capacitance in the device. The variable capacitor provides the ability to precisely control delay in the pulse width modulator, thus facilitating high resolution control of duty cycle in the pulse width modulated signal.

In one embodiment, a pulse width modulator includes a first delay device creating a first delay and a delay adjustment device creating a second delay. A signal generating device is coupled to the first delay device and the delay adjustment device and creates a pulse width modulated signal having a duty cycle responsive to a combination of the first delay and the second delay.

In another embodiment, a pulse width modulator includes a first delay device creating a first delay and a delay adjustment device creating a second delay using a delay block. The delay block includes a first capacitor, the first capacitor coupled to a first current source, wherein the delay block stores a first voltage on the capacitor by charging the first capacitor with the first current source for a determined precharge time period. The delay block also includes a variable capacitor, the variable capacitor coupled to a second current source, and wherein the delay block determines the second delay by charging the variable capacitor and comparing the voltage on the variable capacitor to the first voltage, and wherein the second delay is adjusted by adjusting the variable capacitor. The pulse width modulator also includes a signal generating device coupled to the first delay device and the delay adjustment device, the signal generating device creating a pulse width modulated signal having a duty cycle proportional to the first delay plus the second.

In another embodiment a method of generating a pulse width modulated signal comprises the steps of creating a first delay, creating a second delay; and generating a pulse width modulated signal having a duty cycle responsive to a combination of the first delay plus the second delay.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit of the forthcoming claims.

The invention claimed is:

1. A pulse width modulator, the pulse width modulator comprising:
   a first delay device, the first delay device adapted to create a first delay;
   a delay adjustment device, the delay adjustment device adapted to create a second delay, wherein the delay adjustment device comprises a delay block, and wherein the delay block includes a first capacitor and a variable capacitor having a variable capacitance, and wherein the delay block is adapted to store a first voltage on the first capacitor, and wherein the delay block is adapted to determine the second delay by controllably varying the variable capacitance, charging the variable capacitor to a second voltage and comparing the second voltage on the variable capacitor to the first voltage on the first capacitor such that the second delay is determined at least in part by the controllably varied variable capacitance;
   a signal generating device coupled to the first delay device and the delay adjustment device, the signal generating device adapted to create a pulse width modulated signal having a duty cycle responsive to a combination of the first delay and the second delay.

2. The modulator of claim 1 wherein the first delay device comprises a counter.

3. The modulator of claim 1 wherein the signal generating device comprises a flip-flop.

4. The modulator of claim 1 wherein the variable capacitor comprises an array of switched capacitors coupled together to provide the variable capacitance.

5. The modulator of claim 1 wherein the delay block stores the first voltage on the first capacitor by charging the first capacitor using a current source coupled to the first capacitor for a determined precharge time period.

6. The modulator of claim 5 wherein the determined precharge time period is equal to one-half a clock period.

7. The modulator of claim 5 wherein the first capacitor is coupled to the current source through a current source switch.

8. The modulator of claim 1 wherein the delay block charges the variable capacitor using a second current source coupled to the variable capacitor.

9. The modulator of claim 1 wherein the delay block includes a first switch to selectively discharge the first capacitor.

10. The modulator of claim 1 wherein the delay block includes a second switch to selectively discharge the variable capacitor.

11. A pulse width modulator, the pulse width modulator comprising:
    a first delay device, the first delay device creating a first delay;
    a delay adjustment device, the delay adjustment device creating a second delay using a delay block and wherein the delay block includes:
    a first capacitor, the first capacitor coupled to a first current source, wherein the delay block stores a first voltage on the capacitor by charging the first capacitor with the first current source for a determined precharge time period;
    a variable capacitor, the variable capacitor coupled to a second current source, and wherein the delay block determines the second delay by charging the variable capacitor and comparing the voltage on the variable capacitor to the first voltage, and wherein the second delay is adjusted by adjusting the variable capacitor; and
    a signal generating device coupled to the first delay device and the delay adjustment device, the signal generating device creating a pulse width modulated signal having a duty cycle proportional to the first delay plus the second delay.

12. The modulator of claim 11 wherein the first delay device comprises a counter and a comparator, and wherein the counter provides a count value to the comparator, and wherein the comparator provides an output used to determine when to start charging the first capacitor.

13. The modulator of claim 11 wherein the first delay device comprises a counter and wherein the counter provides a count value to the delay adjustment device, and wherein the count value is used to determine when to start charging the first capacitor.

14. The modulator of claim 11 wherein the signal generating device comprises a flip-flop.

15. The modulator of claim 11 wherein the delay block includes a first switch to selectively discharge the first capacitor, a second switch to selectively discharge the variable capacitor, and wherein the first capacitor is coupled to the current source through a current source switch.

16. The modulator of claim 11 wherein the variable capacitor comprises a switched capacitor circuit having a digitally selected capacitance.

17. A method of generating a pulse width modulated signal, the method comprising the steps of:
    creating a first delay;
    controllably varying a variable capacitance of a variable capacitor;
    storing a first voltage on a first capacitor;
    charging the van able capacitor to a second voltage;
    comparing the first voltage to the second voltage to create a second delay such that the second delay is determined at least in part by the variable capacitance; and
    generating a pulse width modulated signal having a duty cycle responsive to a combination of the first delay plus the second delay.

18. The method of claim 17 wherein the step of controllably varying a variable capacitance of a variable capacitor comprises controllably varying an array of switched capacitors coupled together to provide the variable capacitance.

* * * * *

UNITED STATES PATENT AND TRADEMARK OFFICE
CERTIFICATE OF CORRECTION

PATENT NO. : 7,288,977 B2 Page 1 of 1
APPLICATION NO. : 11/040089
DATED : October 30, 2007
INVENTOR(S) : Michael E. Stanley It is certified that error appears in the above-identified patent and that said Letters Patent is hereby corrected as shown below:

Column 12, line 45, "van able" should be changed to --variable--;

Signed and Sealed this

Sixth Day of May, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,288,977 B2 | Page 1 of 1 |
| APPLICATION NO. | : 11/040089 | |
| DATED | : November 30, 2007 | |
| INVENTOR(S) | : Michael E. Stanley | |

It is certified that error appears in the above-identified patent and that said Letters Patent is hereby corrected as shown below:

In Column 12, Line 46, Claim No. 17:

Change "charging the van able capacitor to a second voltage;" to --charging the variable capacitor to a second voltage;--

Signed and Sealed this

Fifth Day of August, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,288,977 B2 | Page 1 of 1 |
| APPLICATION NO. | : 11/040089 | |
| DATED | : October 30, 2007 | |
| INVENTOR(S) | : Michael E. Stanley | |

It is certified that error appears in the above-identified patent and that said Letters Patent is hereby corrected as shown below:

In Column 12, Line 46, Claim No. 17:

Change "charging the van able capacitor to a second voltage;" to --charging the variable capacitor to a second voltage;--

This certificate supersedes the Certificate of Correction issued August 5, 2008.

Signed and Sealed this

Twenty-sixth Day of August, 2008

JON W. DUDAS
*Director of the United States Patent and Trademark Office*